United States Patent
Rupp et al.

(10) Patent No.: US 6,444,531 B1
(45) Date of Patent: Sep. 3, 2002

(54) DISPOSABLE SPACER TECHNOLOGY FOR DEVICE TAILORING

(75) Inventors: Thomas S. Rupp, Stormville; Scott Halle, Hopewell Junction, both of NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/645,424

(22) Filed: Aug. 24, 2000

(51) Int. Cl.[7] .............................................. H01L 21/336
(52) U.S. Cl. ....................... 438/303; 438/301; 438/305; 438/306
(58) Field of Search ................................ 438/301, 303, 438/305, 306, 307

(56) References Cited

U.S. PATENT DOCUMENTS

| 4,502,914 | A | | 3/1985 | Trumpp et al. ............. 156/643 |
|---|---|---|---|---|
| 4,818,334 | A | | 4/1989 | Shwartzman et al. ....... 156/643 |
| 4,919,748 | A | | 4/1990 | Bredbenner et al. ........ 156/643 |
| 5,116,460 | A | | 5/1992 | Bukhman .................... 156/643 |
| 5,670,401 | A | | 9/1997 | Tseng ........................... 437/44 |
| 5,766,998 | A | | 6/1998 | Tseng ......................... 438/291 |
| 5,798,303 | A | | 8/1998 | Clampitt .................... 438/696 |
| 5,801,077 | A | | 9/1998 | Chor et al. ................. 438/305 |
| 5,858,847 | A | | 1/1999 | Zhou et al. ................. 438/305 |
| 5,861,343 | A | | 1/1999 | Tseng ......................... 438/666 |
| 5,866,448 | A | | 2/1999 | Pradeep et al. ............. 438/231 |
| 5,895,243 | A | * | 4/1999 | Dian et al. .................. 438/297 |
| 5,915,177 | A | | 6/1999 | Tseng ......................... 438/264 |
| 5,956,591 | A | * | 9/1999 | Fulford, Jr. ................. 438/305 |
| 5,998,269 | A | * | 12/1999 | Huang et al. ............... 438/282 |
| 6,022,782 | A | * | 2/2000 | Smith et al. ................ 438/303 |
| 6,221,706 | B1 | * | 4/2001 | Lukane et al. ............. 438/199 |

* cited by examiner

Primary Examiner—Trung Dang
(74) Attorney, Agent, or Firm—Stanton Braden

(57) ABSTRACT

The present provides a method for tailoring silicon dioxide source and drain implants and, if desired, extension implants of different devices used on a semiconductor wafer in order to realize shallow junctions and minimize the region of overlap between the gate and source and drain regions and any extension implants. The method includes the steps of applying a mask over a first gate structure positioned on a semiconductor substrate, depositing a layer of a spacer material over the surface of the first gate structure and a second gate structure adjacent to the first gate structure, etching the spacer material so that a portion of the spacer material remains on the second gate sidewalls and a sidewall of the block out mask, implanting ions into the semiconductor substrate into a region defined between the spacer material on the block out mask and the second gate to form a source or drain region, and removing the spacer material and block out mask. If desired, a second etch can be performed on the spacer material to reduce spacer thickness, and second ions can be implanted into the semiconductor substrate into an implant region defined between the spacer material remaining after the second etch.

14 Claims, 3 Drawing Sheets

DISPOSABLE SPACER TECHNOLOGY FOR DEVICE TAILORING

BACKGROUND OF THE INVENTION

1. Field of the Intention

The present invention generally relates to providing tailored implants for semiconductor devices and, more particularly, to utilizing disposable spacers to define the region of source/drain and extension implants.

2. Background Description

The size of dynamic random access memory (DRAM) chips is expected to reach 64 GBits per chip in the year 2010. By then the gate_length of the metal_oxide_ semiconductor (MOS) transistors that make up such a chip is expected to be approximately 70 nm. There are several benefits to the reduction of feature size and the attendant increase in circuit density. At the circuit performance level, there is an increase in circuit speed. With shorter distances to travel and with the individual devices occupying less space, information can be put into and gotten out of a chip in less time. These same density improvements can also result in a chip that requires less power to operate. Also, making the individual chip components smaller and closer together, along with creating a larger chip, yields faster and more powerful circuits.

For scalable DRAM and logic technologies beyond 0.15 :m minimum feature size, a separate tailoring of impurity implants of the different devices used on the same chip is needed to control device characteristics and undesirable effects are encountered in extremely small devices. For example, as gate dimensions shrink, the gate leakage current due to short_channel effects becomes an ever_increasing issue. The control of short_channel effects in metal oxide semiconductor field effect transistors (MOSFETs) is one of the biggest challenges in scaling to sub_0.1 micron dimensions. In the ideal case, a MOSFET should behave like a switch, i.e. the device current drive should be high when the device is on, and there should be minimal leakage in the device when the device is off As device dimensions are reduced, it becomes very difficult to maintain this ideal switching behavior of complementary metal oxide semiconductor (CMOS) transistors. The primary impact of the short_channel effect is to increase the leakage or off_ current when the devices are in the off_state. To scale devices into the sub_0.1 micron dimensions, there have been significant efforts devoted to the aggressive design of the dopant profiles within the device.

In larger devices, it has been the practice to control dopant profile at the ends of the conduction channel adjacent to the source and drain regions. This practice has been extended to sub-lithographic dimensions by the use of insulative spacers (generally oxide) which are formed on the sides of the gate structure. That is, after the gate structure is formed, a first impurity implant is performed self-aligned with the gate structure, a sidewall spacer is formed on the sides of the gate structure and another impurity implantation process is performed self-aligned with the sidewalls. This process can be repeated to develop more complex impurity concentration profiles. However, the sidewall spacers which are built up during this process cannot be removed and must, in the context of preferred CMOS technology, generally be applied to both the NFET and PFET of a complementary transistor pair. Since the conduction characteristics of these devices are very different and the transistors generally formed at different sizes to obtain similar current conduction, the conduction characteristics cannot be simultaneously optimized for both types of transistor on a single chip.

For example, to avoid hot carrier effects, a particular type of short channel effect, several techniques have been proposed. One of these techniques is lightly doped drain extension regions, or "LDD" regions. In this structure, a first light and shallow implant is performed before sidewall spacers are formed on the gate structure. Sidewall spacers are conventionally used as an aid to source/drain profiling, since they provide a self-aligned sublithographic pattern modification. After the sidewall spacers are in place, a second heavier implant is performed. The first implant provides only a relatively low conductivity in the silicon, but this prevents the channel_drain voltage difference from appearing entirely at the drain boundary. By increasing the distance over which this voltage difference occurs, the peak electric field is reduced, and this tends to reduce channel hot carrier (CHC) effects. The doses needed for LDD regions have now become closer to those used for the main source/drain implant, and therefore LDD regions are often referred to as "MDD" (medium_doped drain) regions.

In addition to reducing undesirable device operational characteristics, there also exists a need to provide a fabrication method that can provide tailored spacer thicknesses for P-FETs (p-type field effect transistor) and N_FETs (n-type field effect transistor). By providing different spacer thicknesses for P-FETs and N-FETs, the distance between source, drain and gate regions for each type device could be tailored independently, which can advantageously be used to control, for example, the diffusion constant between P-FETs and N-FETs. However, separate and independent tailoring of NFET and PFET devices cannot be achieved using conventional built-up spacers without extreme process complexity and criticality (such as multiple implant block out masking processes) and attendant compromise of manufacturing yield.

Additionally, extremely high integration density in, for example, DRAM arrays implies a need to form structures having equal line and space dimensions at the minimum lithographic feature size, referred to as "on pitch". An on pitch DRAM array and other on pitch devices cannot tolerate wider spacers (e.g. approaching one-half the minimum feature size or greater) which might be required for support junctions. That is, since conventional built-up spacers cannot be removed, a spacer width of one-half the minimum feature size would completely close the structure and preclude the formation of contacts. Insufficient space for contacts may result from even somewhat narrower spacers in devices formed at extremely high integration density.

SUMMARY OF THE INVENTION

It is therefore an object of the invention to provide a method for tailoring source and drain implants of different devices used on the same chip in order to minimize the region of overlap of the source and drain regions into the gate region.

It is another object of the invention to provide a method for tailoring impurity implants of the different devices.

It is yet another object of the invention to provide a method that enables different spacer thicknesses for P-FETs and N-FETs to be fabricated independently.

It is a further object of the invention to provide a reduction in process complexity for manufacture of CMOS integrated circuits by avoidance of at least one implant block out mask process.

In the preferred embodiment, the method involves applying a block out mask over a first gate structure. The mask is exposed, and a layer of spacer material, preferably a polymer, is deposited over the block out mask and a second gate structure adjacent to the block out mask. Preferably, a reactive ion etch (RIE) is performed to form spacers, from the spacer material, along the side of the block out mask material and second gate structure. A source/drain (S/D) implant is then applied in the region defined by the spacers. An additional isotropic etch is used to reduce the spacer thickness. The reduced spacer thicknesses defines the region for extension implants. This process, in accordance with the invention reverses the order of the source/drain and extension implants and avoids one block out masking process for each reduction in spacer thickness. Standard resist and polymer material strip process are then performed to take off and dispose of the block out mask and spacers.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
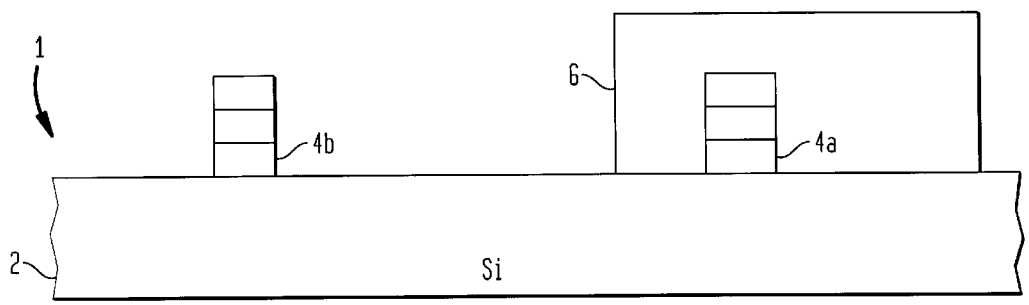
FIG. 1 shows a substrate having a block out mask applied over a first gate structure.

Referring now to the drawings, and specifically to FIG. 1, a structure 1 comprising a semiconductor substrate 2 having a block out mask 6 applied over a gate structure 4a and the region of the substrate surrounding the gate structure is shown. The block out mask 6 may be comprised of any number of suitable materials widely known to those skilled in the art, and can be applied in accordance with conventional processing steps also widely known to those skilled in the art. It should also be understood that the invention is not limited to the two gate structures 4a and 4b, and that additional gate structures will normally be provided on the substrate 2.

Figure 2:
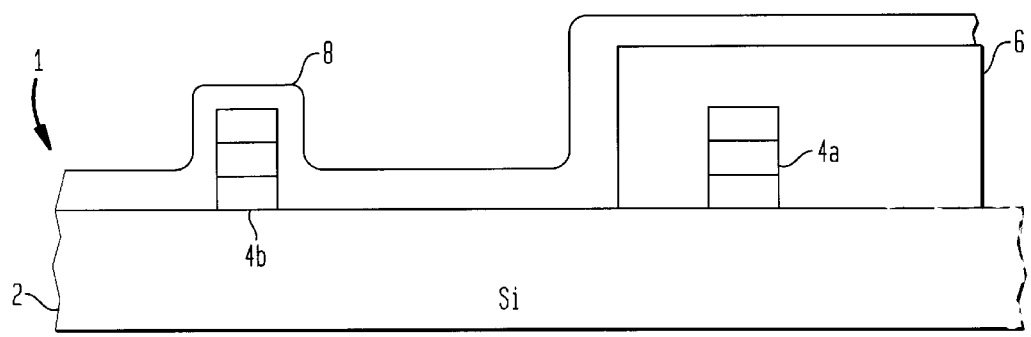
FIG. 2 shows an isotropic deposition of a polymer over a second gate structure and the block mask.

FIG. 2 shows an isotropic deposition of a spacer material 8 over the block out mask 6 and gate structure 4b. The spacer material 8 is preferably applied in accordance with conventional processing steps widely known to those skilled in the art. It is preferred that the spacer material 8 be a polymer, particularly conformal anti-reflective coating (ARC) layers or chemical vapor deposition (CVD) silicon-containing carbon films such as polysilane and polysiloxane, and have a preferred thickness in the range of 100 to 1000 Angstroms. However, it should also be readily understood by those skilled in the art that the invention can also be practiced using other spacer thicknesses and/or materials depending, for example, on design objectives and manufacturing considerations such as selectivity to underlying layers.

Figure 3:
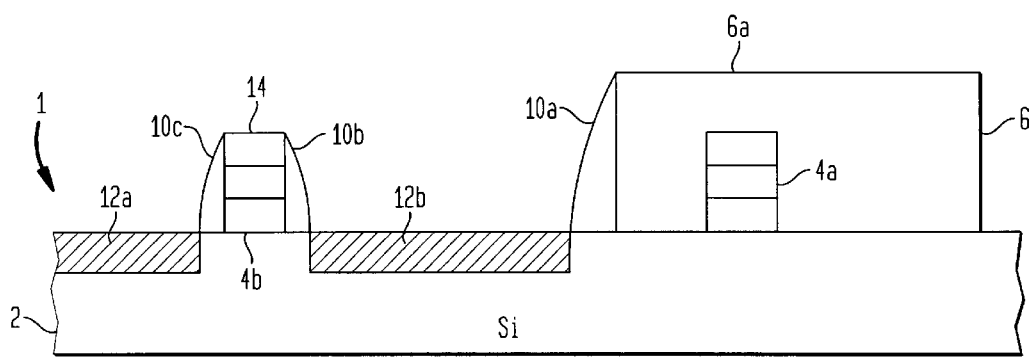
FIG. 3 shows an anisotropic reactive ion etching of the polymer spacer and source and drain implants.

In FIG. 3, an anisotropic spacer etch, preferably a RIE, is performed to expose the top portion 14 of gate structure 4b, and the top portion 6a of block out mask 6. The etch leaves polymer sidewall 10a on block out mask 6, and polymer sidewalls 10b and 10c on gate structure 4b. Subsequent to the etching, source 12a and drain 12b implants are provided in accordance with conventional processing steps. Note that the polymer sidewalls 10a, 10b and 10c define the region in which the source 12a and drain 12b implants are provided.

Figure 4:
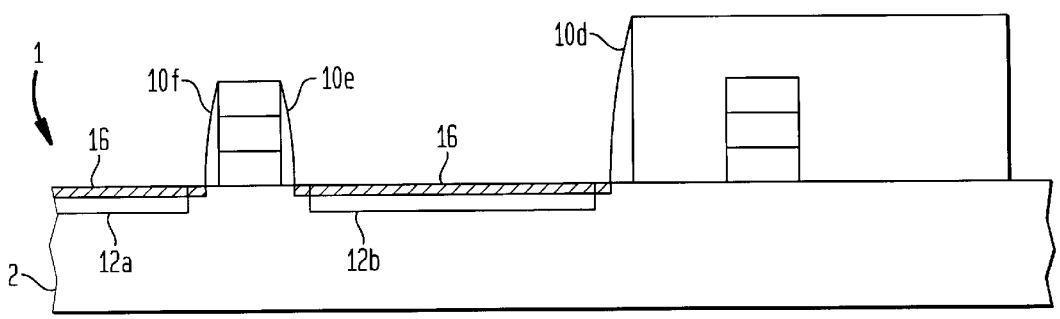
FIG. 4 shows additional isotropic spacer etching and subsequent extension implants.

FIG. 4 shows the structure 1 after additional isotropic etching of the polymer sidewalls 10a, 10b and 10c in FIG. 3 by chemical downstream etching which is highly selective to the exposed oxide, nitride and silicon film, resulting in the thinner (e.g. 100 to 800 Angstroms) sidewalls 10d, 10e and 10f, respectively, shown in FIG. 4. Subsequent to this etching, extension implants 16 are provided in accordance with conventional processing steps. Note that, similar to FIG. 3, the polymer sidewalls 10d, 10e and 10f define the region in which the extension implants 16 are provided. This process of reduction of sidewall thickness followed by an extension implant may be repeated as may be necessary to obtain any desired dopant profile. Any dopant concentration (e.g. $1 \times 10^{12}$ to $8 \times 10^{15}$ atoms/cm$^3$) required by any transistor design may be employed after any spacer thickness reduction or removal process.

Figure 5:
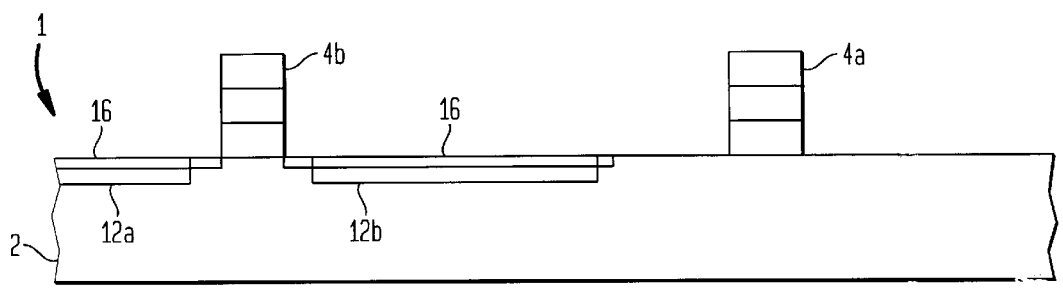
FIG. 5 shows the resulting structure after final stripping of the spacers and block out mask.

FIG. 5 shows the final structure 1 after removal of the polymer sidewalls 10d, 10e and 10f, and block mask 6 in accordance with conventional processing steps. If, at any point in the process, the remaining polymer spacer is to be removed in its entirety to result in the structure shown in FIG. 5, any resist stripping process which is similarly selective to oxide, nitride and silicon can be employed. As will be appreciated by those skilled in the art, after these steps the structure 1 may also be annealed in accordance with conventional processing steps to produce further desired device characteristics.

Figure 6A:
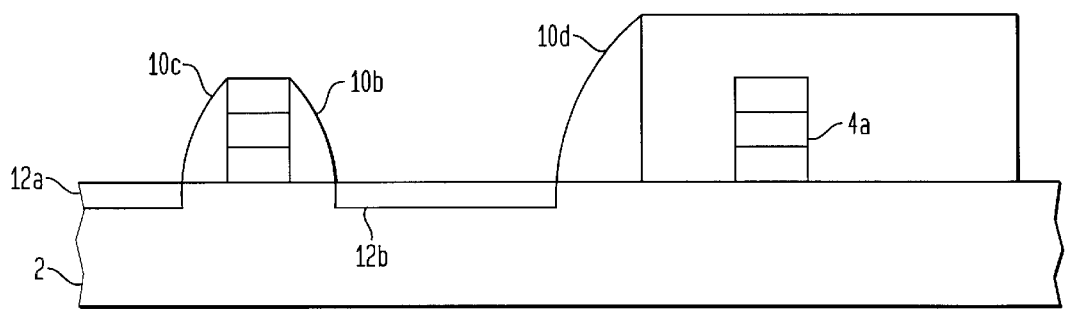
FIGS. 6a to 6d show the sequence steps of the invention when practiced with a plurality of etches of the polymer, and a plurality of associated implants.
Figure 6B:
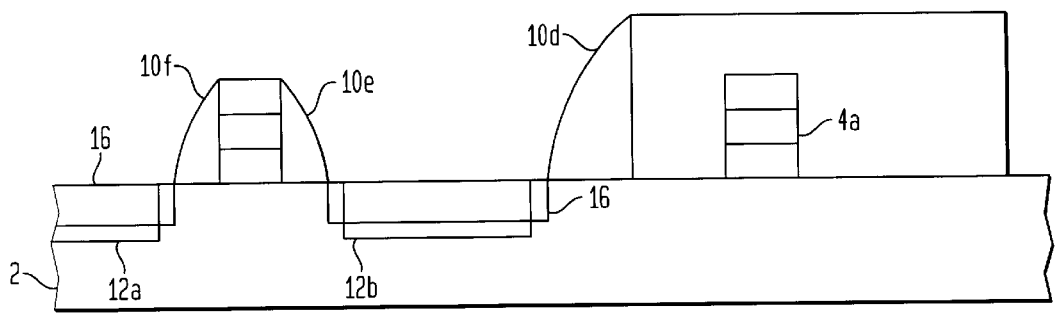
Figure 6C:
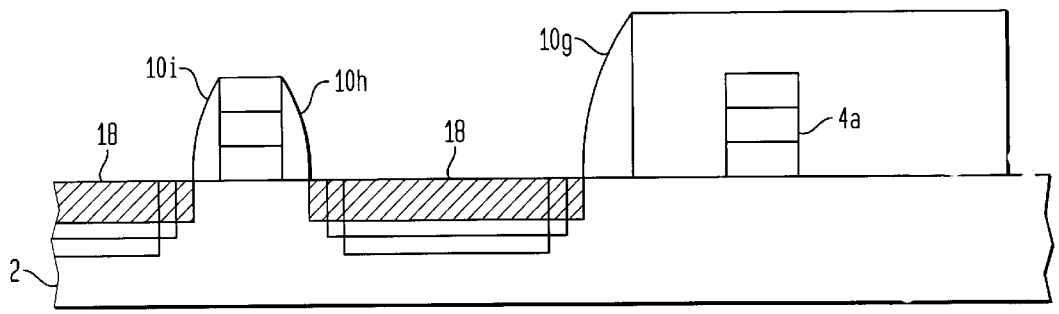
Figure 6D:
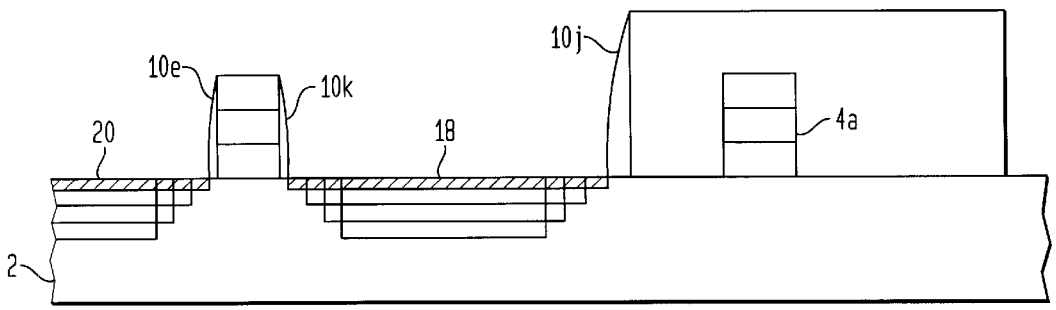

In view of the foregoing, it is seen that the invention provides a method for tailoring source and drain implants of different devices used on the same chip in order to realize shallow junctions and minimize the region of overlap of source and drain regions into the gate region. This meritorious effect of the invention will also be produced in variations of the invention. For example, as shown in FIGS. 6a to 6d, the invention can also be practiced by providing a plurality of etches and implants. FIG. 6a corresponds to FIG. 3, except that spacers 10a, 10b and 10c contact more surface area of the wafer 2. FIG. 6b corresponds to FIG. 4, except that spacers 10d, 10e and 10f contact more surface area of the wafer 2. This being the case, there is a sufficient portion of the spacer 10d, 10e and 10f remaining to permit subsequent RIEs. As shown in FIG. 6c, after another RIE, the portion of spacers 10g, 10h and 10i remaining permit a second extension implant 18. As shown in FIG. 6d, after yet another RIE, the portion of spacers 10j, 10k and 10l remaining permit a third extension implant 20. Finally, to complete processing, polymer sidewalls 10j, 10k and 10l would be removed in accordance with conventional processing techniques.

In summary, it is seen that the invention provides a method for tailoring source and drain and, if desired, extension implants of different devices used on the same chip. While various embodiments of the present invention have been described above, it should be understood that they have been presented by way of example only. Thus, the breadth and scope of the present invention should not be limited by any of the above_described exemplary embodiments, but should be defined only in accordance with the following claims and their equivalents.

Having thus described our invention, what we claim as new and desire to secure by Letters Patent is as follows:

1. A method of fabricating an integrated circuit device comprising the steps of:
    applying a mask over a first gate structure positioned on a semiconductor substrate;
    depositing a layer of a spacer material over the mask and over a second gate structure adjacent to the first gate structure;
    etching the spacer material so that a portion of the spacer material remains on second gate sidewalls and on a sidewall of the block mask;
    implanting ions into the semiconductor substrate into an implant region defined between the spacer on the block mask and on the second gate to form a source or drain region;
    performing a second etch on the spacer material;
    implanting second ions into the semiconductor substrate into an implant region defined between the spacer material remaining after the second etch; and
    removing the spacer material and block mask.

2. The method as recited in claim 1, wherein the spacer material is a polymer.

3. The method as recited in claim 2, wherein the polymer has a thickness between 100 and 1000 Angstroms.

4. The method as recited in claim 2 wherein the polymer layer is comprised of one of conformal ARC layers and silicon containing carbon films.

5. A method of fabricating an integrated circuit device comprising the steps of:
    applying a mask over a first gate structure positioned on a semiconductor substrate;
    depositing a layer of a spacer material over the mask and over a second gate structure adjacent to the first gate structure;
    etching the spacer material so that a portion of the spacer material remains on second gate sidewalls and on a sidewall of the block mask;
    implanting ions into the semiconductor substrate into an implant region defined between the spacer material on the block mask and on the second gate to form a source or drain region; and
    removing the spacer material and block mask;
    wherein the spacer material is a polymer comprised of one of conformal ARC layers and silicon containing carbon films;
    wherein said silicon containing carbon films include at least one of polysilane and polysiloxane.

6. The method as recited in claim 2 wherein the polymer is formed by conformal deposition.

7. The method as recited in claim 1 wherein the etching is a reaction ion etch (RIE).

8. The method as recited in claim 7 wherein the RIE etch exposes a top surface of the second gate and a top surface of the block mask.

9. The method as recited in claim 1 wherein the ions are implanted at a dosage of between about $1\times10^{12}$ to $8\times10^{15}$ atoms/cm$^3$.

10. A method of fabricating an integrated circuit device comprising the steps of:
    applying a mask over a first gate structure positioned on a semiconductor substrate;
    depositing a layer of a spacer material over the mask and over a second gate structure adjacent to the first gate structure;
    etching the spacer material so that a portion of the spacer material remains on second gate sidewalls and on a sidewall of the block mask;
    implanting ions into the semiconductor substrate into an implant region defined between the spacer material on the block mask and on the second gate to form a source or drain region; and
    removing the spacer material and block mask;
    wherein the spacer material is reduced in thickness by stripping chemical downstream etching selectively to exposed oxide, nitrade and silicon.

11. The method as recited in claim 1, wherein the polymer after the second etch has a thickness between 100 and 800 Angstroms.

12. The method as recited in claim 1, wherein the second etch is a RIE.

13. The method as recited in claim 1 wherein the second ions are implanted at a dosage of between about $1\times10^{12}$ to $8\times10^{15}$ atoms/cm$^3$.

14. The method as recited in claim 1 wherein the spacer material is removed by a resist stripping process which is selective to exposed oxide, nitride and silicon.

* * * * *

UNITED STATES PATENT AND TRADEMARK OFFICE
CERTIFICATE OF CORRECTION

PATENT NO. : 6,444,531 B1  Page 1 of 1
DATED : September 3, 2002
INVENTOR(S) : Thomas S. Rupp and Scott Halle It is certified that error appears in the above-identified patent and that said Letters Patent is hereby corrected as shown below:

<u>Title page,</u>
Item [74], *Attorney, Agent, or Firm*, "Stanton Braden" should read -- Lerner, David, Littenberg, Krumholz & Mentlik, LLP --.
Item [57], ABSTRACT,
Line 1, insert -- invention -- after "present".

In all instances, "block out" should read -- block-out --.

<u>Column 1,</u>
Line 39, "off" should read -- off. --.

Signed and Sealed this

Fifteenth Day of July, 2003

JAMES E. ROGAN
*Director of the United States Patent and Trademark Office*